United States Patent
Seppäläet al.

(10) Patent No.: US 6,876,192 B2
(45) Date of Patent: *Apr. 5, 2005

(54) TESTING SYSTEM IN A CIRCUIT BOARD MANUFACTURING LINE FOR A AUTOMATIC TESTING OF CIRCUIT BOARDS

(75) Inventors: Hannu Seppälä, Salo (FI); Pekka Kurppa, Salo (FI); Jarmo Teeri, Salo (FI)

(73) Assignee: PMJ Automec OYJ, Virkkala (FI)

( * ) Notice: Subject to any disclaimer, the term of this patent is extended or adjusted under 35 U.S.C. 154(b) by 17 days.

This patent is subject to a terminal disclaimer.

(21) Appl. No.: 10/381,070

(22) PCT Filed: Sep. 21, 2001

(86) PCT No.: PCT/FI01/00829

§ 371 (c)(1),
(2), (4) Date: Mar. 19, 2003

(87) PCT Pub. No.: WO02/25301

PCT Pub. Date: Mar. 28, 2002

(65) Prior Publication Data

US 2003/0179006 A1 Sep. 25, 2003

(51) Int. Cl.⁷ .......................... G01R 1/04; H01R 31/02
(52) U.S. Cl. ................................ 324/158.1; 324/537
(58) Field of Search ............................ 324/158.1, 537; 198/409, 411, 413–414

(56) References Cited

U.S. PATENT DOCUMENTS

| 4,845,843 | A | | 7/1989 | Babcock |
| 5,009,306 | A | * | 4/1991 | Roderick et al. ........... 198/414 |
| 5,093,984 | A | * | 3/1992 | Lape ........................... 324/537 |
| 5,184,068 | A | | 2/1993 | Twigg et al. |
| 5,680,936 | A | | 10/1997 | Beers |
| 5,848,705 | A | * | 12/1998 | Gianpaolo et al. ....... 324/158.1 |
| 6,145,191 | A | * | 11/2000 | Baldwin ..................... 29/840 |
| 6,232,766 | B1 | | 5/2001 | Saouli et al. |
| 6,378,690 | B1 | * | 4/2002 | Pessina et al. .............. 198/414 |
| 6,614,220 | B2 | * | 9/2003 | Mang et al. ............. 324/158.1 |

FOREIGN PATENT DOCUMENTS

| DE | 44 16 755 | 11/1995 |
| GB | 2229540 | 9/1990 |
| JP | 1-259271 | 10/1989 |
| JP | 9-89960 | 4/1997 |

* cited by examiner

Primary Examiner—David Zarneke
Assistant Examiner—Jermele Hollington
(74) Attorney, Agent, or Firm—Merchant & Gould P.C.

(57) ABSTRACT

A testing system for automatic testing of circuit boards (1) in a circuit board manufacturing line. The testing system comprises a set (I) of test modules (4) comprising a testing apparatus. Each test module comprises a horizontal module conveyor (5) for conveying a circuit board (1) into and out of the test module. The test modules are arranged in a superposed relation with respect to each other. The set (I) contains test modules differing from each other so that the testing operations performed by these test modules are different from each other. A feed device (6) has been fitted to receive circuit boards from the first line conveyor (3) and to feed them into the test modules (4).

19 Claims, 7 Drawing Sheets

Figure 1:
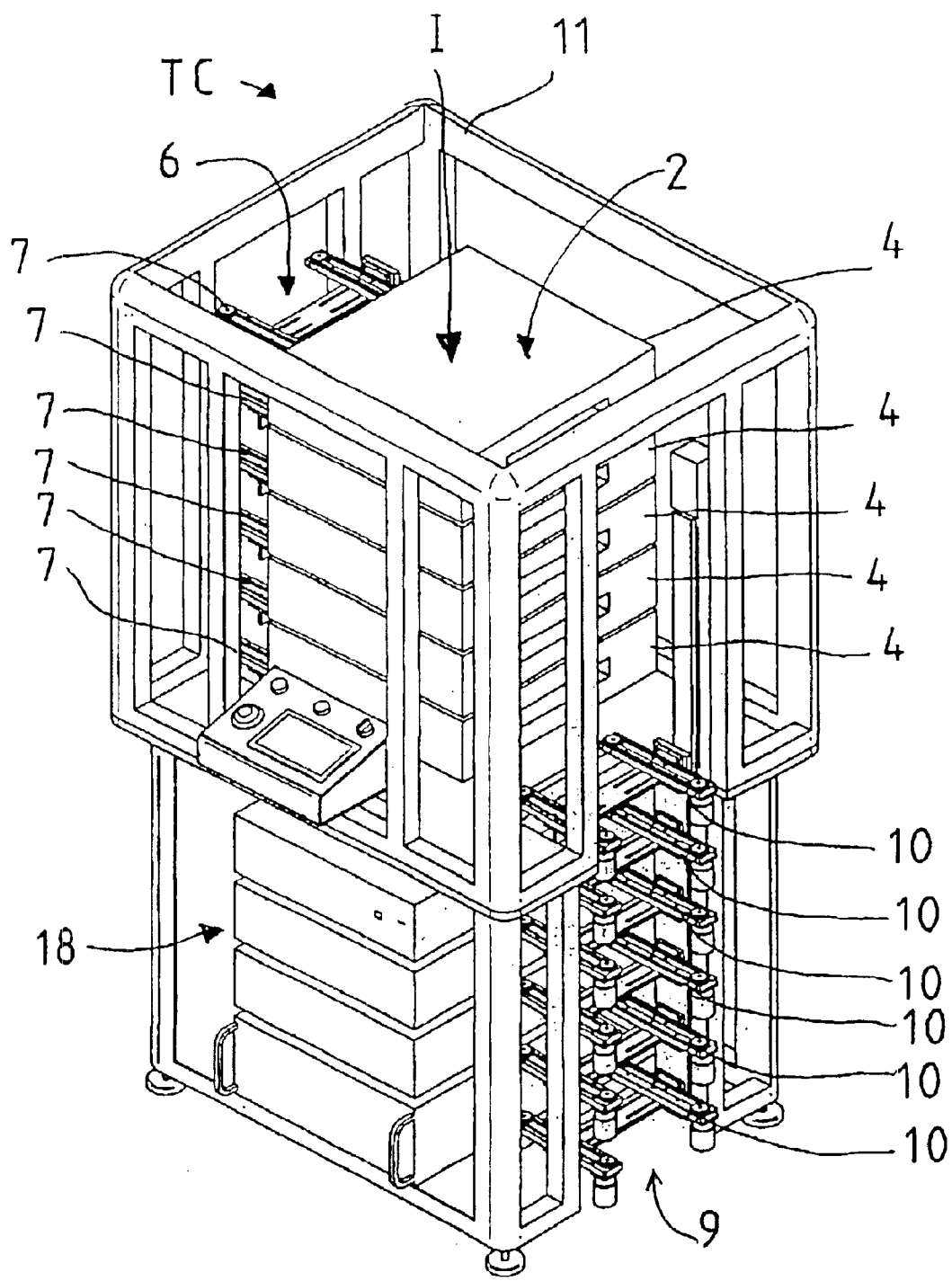

TESTING SYSTEM IN A CIRCUIT BOARD MANUFACTURING LINE FOR A AUTOMATIC TESTING OF CIRCUIT BOARDS

FIELD OF THE INVENTION

The present invention relates to a testing system as defined in the preamble of claim 1.

BACKGROUND OF THE INVENTION

The invention relates to so-called inline testing performed in connection with a circuit board manufacturing line. On the manufacturing line, components are set and soldered on a circuit board, whereupon a testing system tests the circuit board and components in accordance with a set of predetermined instructions, such as a computer program, to determine their electric operation. The manufacturing line comprises a line conveyor which conveys the circuit boards horizontally in succession as a file to a testing apparatus. A conveyor comprised in the testing system conveys the circuit board into a testing station, a positioning device stops it at the proper position and contacting means comprised in a testing device establish an electric contact with the circuit board, whereupon the testing apparatus automatically carries out the required testing operations on the circuit board. After the test, the circuit board is removed from the testing apparatus and allowed to move further on the manufacturing line.

In prior art, a testing system is known in which a number of testing apparatus are disposed side by side or one after the other on the same level with the line conveyor. A problem with a system like this is that the adjacent testing apparatuses disadvantageously increase the length of the production line in confined industrial facilities.

The object of the invention is to eliminate the above-mentioned disadvantages.

A specific object of the invention is to disclose a system that is as compact as possible and occupies a small proportion of the length of the production line.

The system of the invention is characterized by what is presented in claim 1.

BRIEF DESCRIPTION OF THE INVENTION

According to the invention, the testing system comprises a set of test modules comprising a testing apparatus, each one of said test modules comprising a horizontal module conveyor for conveying a circuit board into and out of the test module, said test modules being arranged in a superposed relation with respect to each other. The set contains mutually differing test modules, so that the testing operations performed by these modules also differ from each other. A feed device has been fitted to receive circuit boards from a first line conveyor and to feed them into the test modules.

The invention has the advantage that different tests can be performed on the circuit boards within a production line length corresponding to the line length required by a single test, thus permitting more effective utilization of the floor area of the production plant. If the number of test modules placed one above the other in the set is n, then it is possible to implement n different tests within the line length of a single test module.

In an embodiment of the system, the circuit board is provided with an identification code or the like which specifies a predetermined testing operation to be performed on the circuit board. The system comprises an identifying device for identifying the identification code. The feed device has been fitted to feed the circuit board on the basis of the identification code into the one of the test modules that will perform the predetermined testing operation on the circuit board.

In an embodiment of the system, the manufacturing line comprises a second line conveyor, whose conveying direction is the same as the conveying direction of the first line conveyor and which, as seen in the conveying direction, is disposed after the testing apparatus to receive the circuit boards from the testing apparatus and to convey them horizontally in succession as a file. The system comprises a receiving device disposed on the opposite side of the test modules in relation to the feed device and fitted to receive circuit boards from the test modules and to pass on the circuit boards onto the second line conveyor so that they form a successive file on it.

In an embodiment of the system, each test module in the test module set has been arranged to perform a test that is different from the test performed by any other test module in the same set.

In an embodiment of the system, the feed device has been arranged to both feed a circuit board into the test module and receive one from it, and the receiving device has been arranged to both receive a circuit board from the test module and feed one into it.

In an embodiment of the system, the feed device, the receiving device and the test modules have been arranged to cooperate with each other so as to pass the circuit boards successively through each test module in the test module set so that a number of testing procedures corresponding to the number of test modules are performed successively on the circuit boards.

In an embodiment of the system, the feed device is a feed elevator moving in a vertical direction and comprising a number of first elevator plane conveyors disposed one above the other at a distance from each other corresponding to the distance between the module conveyors so that, when the first elevator plane conveyors are in alignment with the module conveyors, the circuit boards can be moved from one conveyor onto the other.

In an embodiment of the system, the receiving device is a vertically movable receiving elevator comprising a number of horizontal two-way second elevator plane conveyors disposed one above the other at a distance from each other corresponding to the distance between the module conveyors so that, when the second elevator plane conveyors are in alignment with the module conveyors, the circuit boards can be moved from one conveyor onto another.

In an embodiment of the system, the module conveyors are two-way conveyors.

In an embodiment of the system, the first elevator plane conveyors and the second elevator plane conveyors are two-way conveyors.

In an embodiment of the system, the system comprises a second set of test modules comprising a testing apparatus and disposed beside the first set of test modules to perform tests on the circuit boards that are different from the tests performed by the test modules of the first set.

In an embodiment of the system, each test module in the second set comprises a horizontal module conveyor for moving a circuit board into and out of the test module, the test modules of the second set being disposed in a superposed relation to each other and adjacently to the test modules of the first set so that their module conveyors are in alignment with each other in immediate vicinity of each other to allow the circuit boards to be moved directly from the module conveyor of a test module of the first set onto the module conveyor of a test modules of the second set.

In an embodiment of the system, the feed device, the test module set and the receiving device have been assembled into a single unit built in a common mounting frame to form a testing cell which can be incorporated in a modular manufacturing line consisting of different cells.

In an embodiment of the system, the mounting frame comprises guide supporters placed at a vertical distance from each other to support the test modules one above the other and allowing the test module supported by said guide supporters to be removed from and inserted into the mounting frame by a horizontal movement.

In an embodiment of the system, the test module comprises a cassette-like frame box inside which the module conveyor and the testing apparatus are mounted, said frame box comprising a back wall provided with rear connectors for the supply of electricity or the like and/or for the transmission of control data. The mounting frame is provided with counter-connectors so fitted that the rear connectors and the counter-connectors are coupled when the test module is being mounted in the mounting frame.

In an embodiment of the system, the test modules are disposed above the level of the line conveyors.

In an embodiment of the system, the system comprises a horizontal transit conveyor disposed below the lowest one of the test modules in the test module set, in alignment with the line conveyor, for conveying circuit boards through the testing system without having them tested.

In an embodiment of the system, the mounting frame comprises a control gear space disposed below the test modules to accommodate the control devices used to control the test modules and the feeding and receiving elevators.

In an embodiment of the system, the feed elevator and/or the receiving elevator comprises a vertical guide rail fixed to the mounting frame; a hoisting slide arranged to be movable along the guide rail, the elevator plane conveyors being connected to said hoisting slide one above the other at a fixed distance from each other; and a positioning actuator for moving and positioning the hoisting slide. The positioning actuator may consist of e.g. a pneumatic linear drive unit, a servo motor-operated screw, such as a ball screw, or a linear stepping motor. The positioning actuator may also consist of any other servo-controlled actuator having a sufficient positioning accuracy and speed of movement.

LIST OF ILLUSTRATIONS

Figure 2:
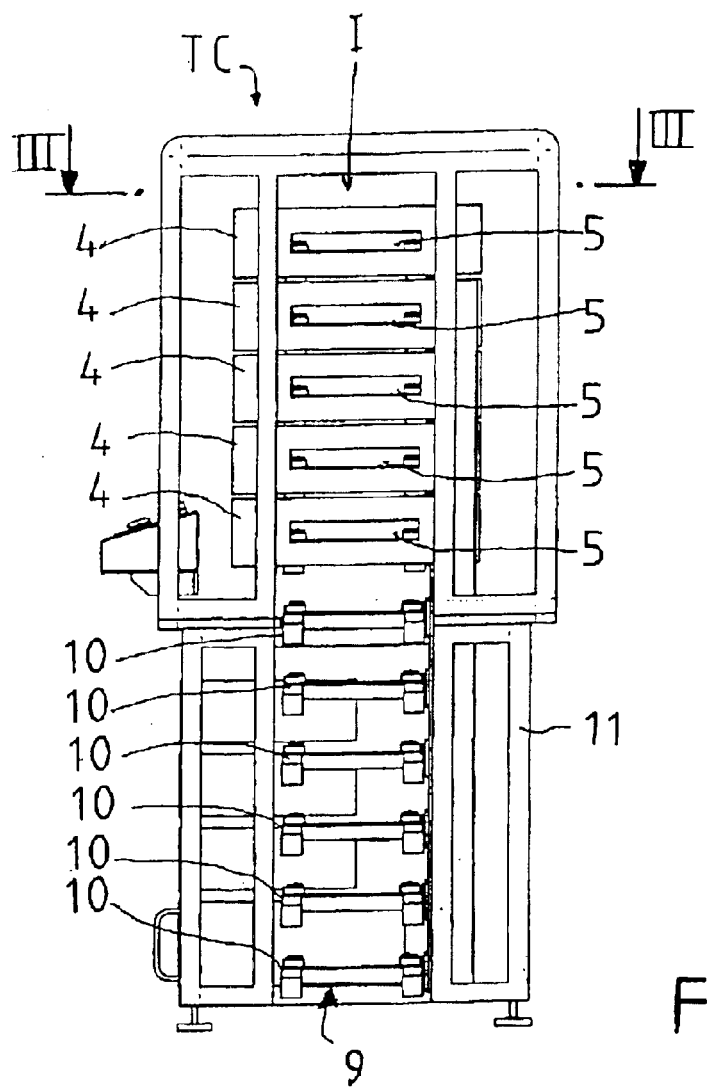
Figure 3:
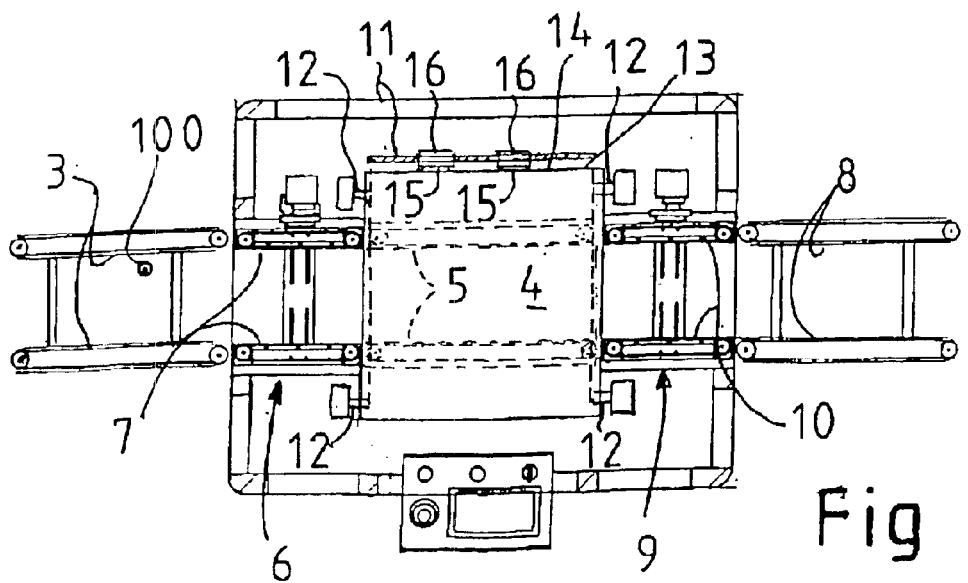
Figure 4:
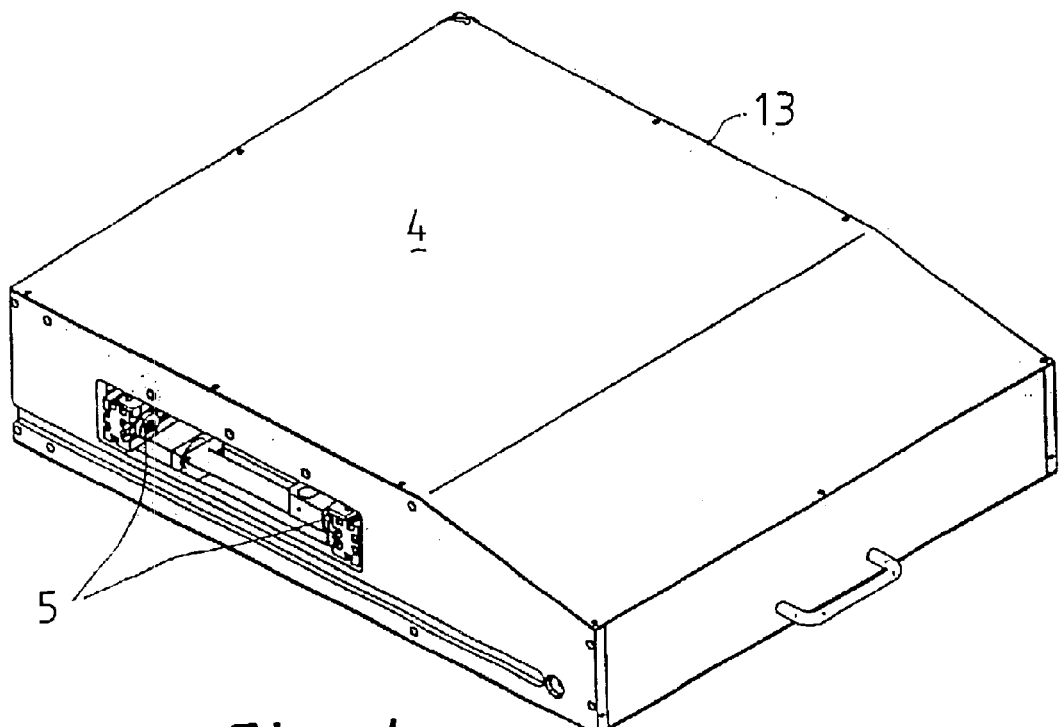
Figure 5:
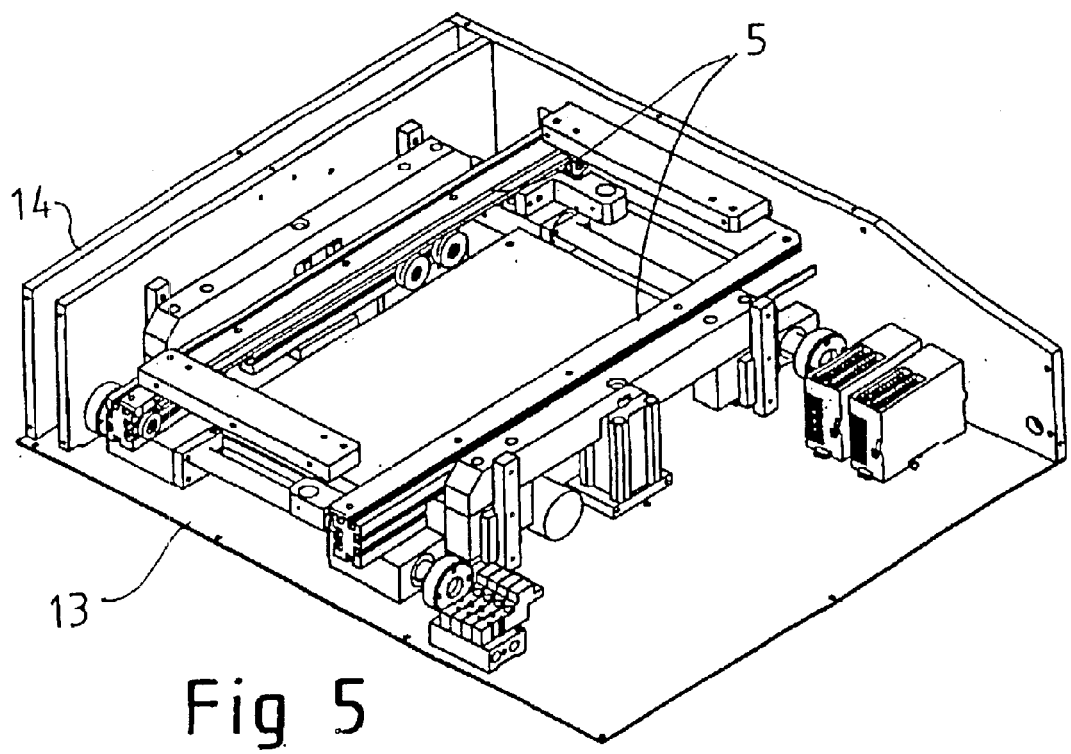
Figure 6:
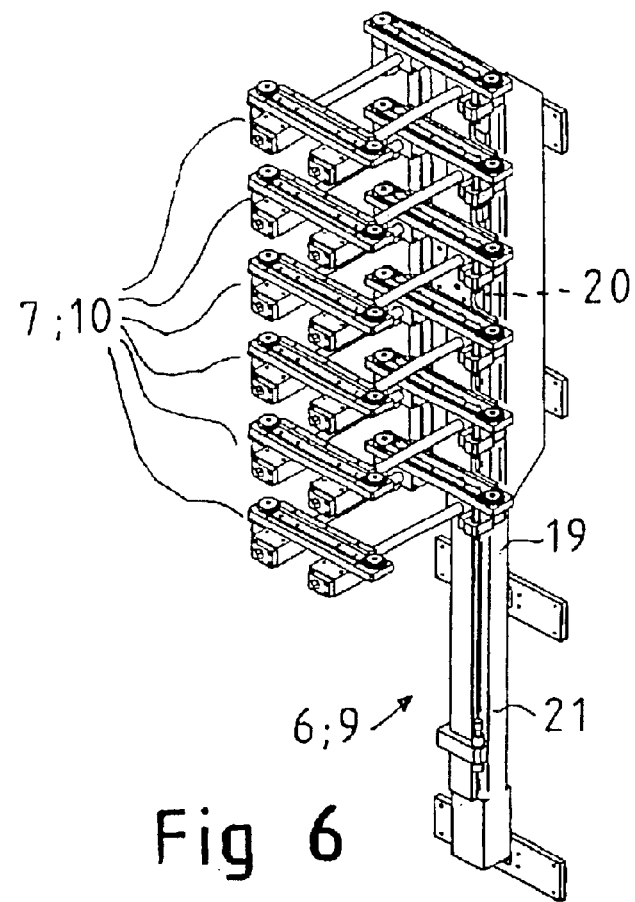
Figure 7:
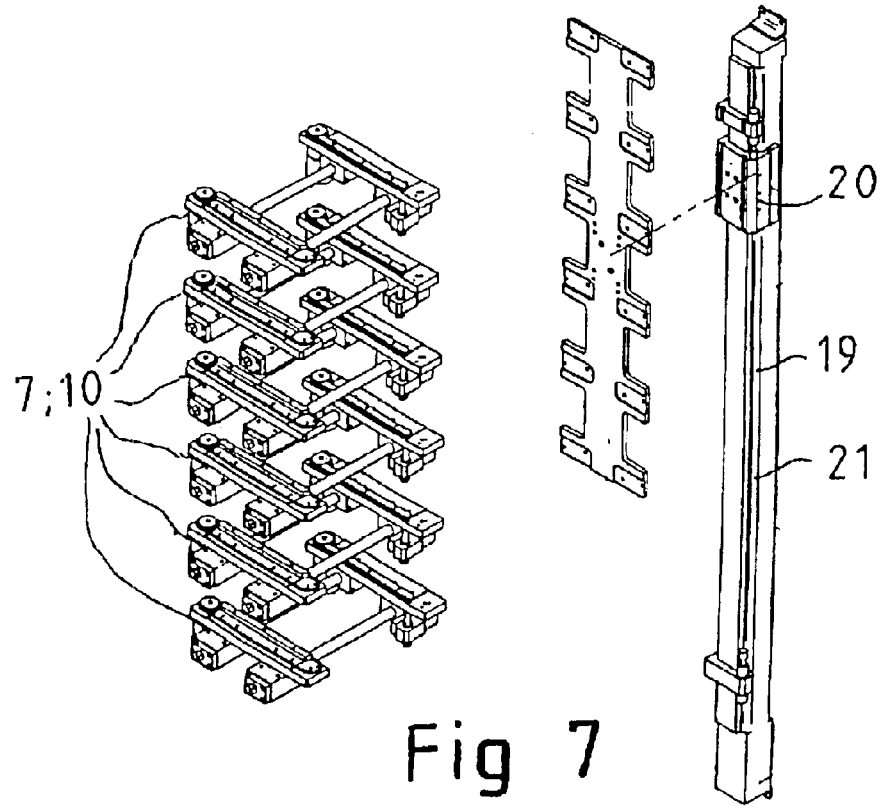
Figure 8:
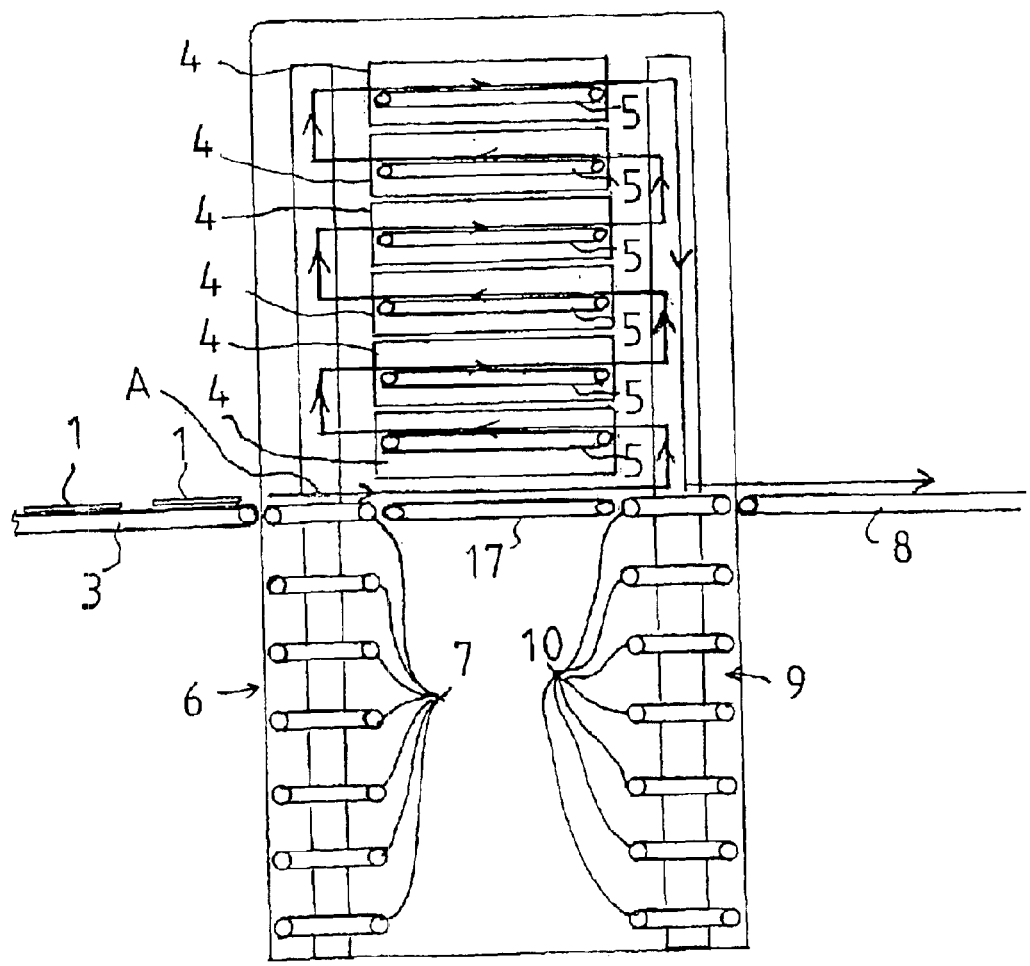
Figure 9:
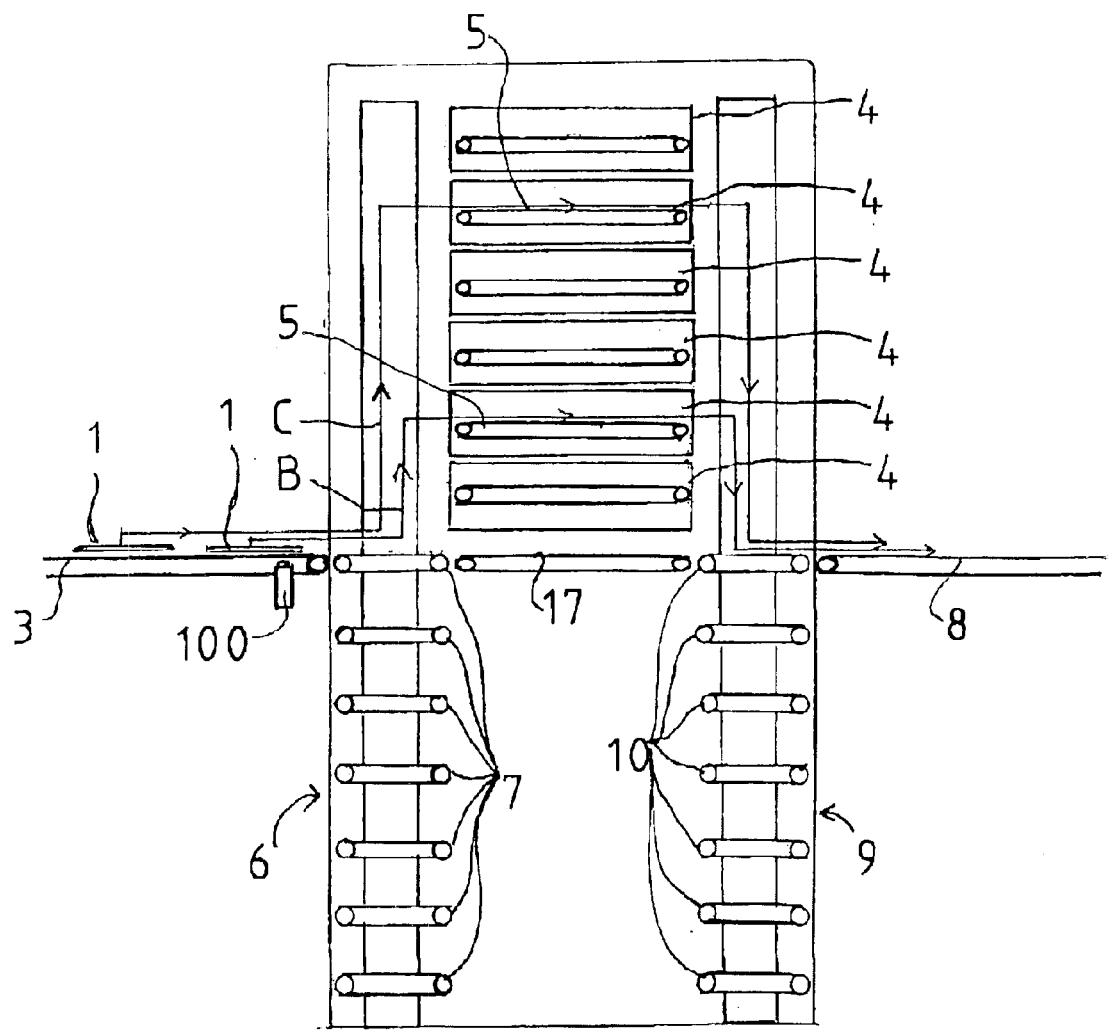
Figure 10:
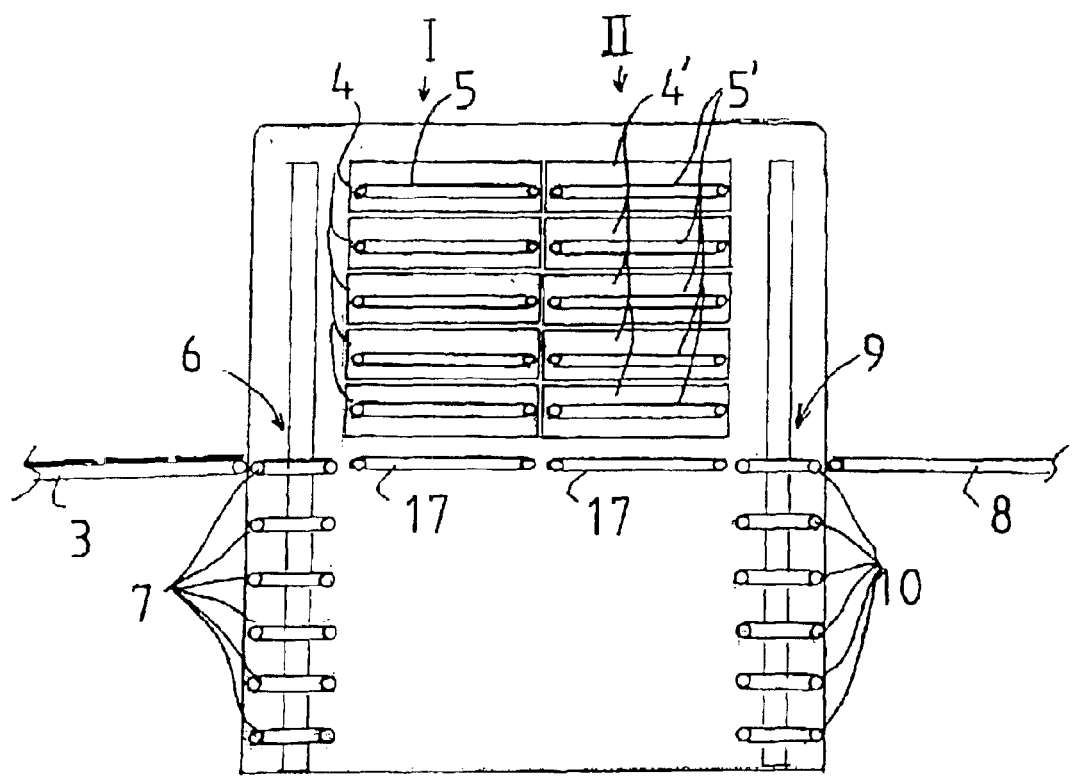

In the following, the invention will be described in detail by the aid of examples of its embodiments with reference to the attached drawings, wherein FIG. 1 presents an axonometric oblique top view of a testing cell according to an embodiment of the system of the invention, FIG. 2 presents a lateral view of the testing cell of FIG. 1, FIG. 3 presents a section III—III through the testing cell of FIG. 2, FIGS. 4 and 5 present a test module according to an embodiment of the system of the invention in an axonometric oblique top view, FIG. 6 presents a feed elevator or receiving elevator according to an embodiment of the system of the invention in an axonometric oblique top view, FIG. 7 presents the elevator of FIG. 6 in a partially exploded view, FIG. 8 presents an example of the operation of the testing cell according to an embodiment of the system of the invention in diagrammatic lateral view, FIG. 9 presents another example of the operation of the testing cell according to an embodiment of the system of the invention in diagrammatic lateral view, and FIG. 10 presents a skeleton diagram of a testing cell according to another embodiment of the system of the invention in lateral view.

DETAILED DESCRIPTION OF THE INVENTION

FIGS. 1–3 present a testing cell TC which can be installed as a modular part in a circuit board manufacturing line, designed for automatic testing of circuit boards with components mounted on them. FIG. 3 illustrates the placement of the testing cell TC in the production line so that on both sides of the testing cell TC there is a line conveyor, a first line conveyor 3, which is placed before the testing cell, i.e. on the supply side of it with respect to the conveying direction of the line, and a second line conveyor 8, which is placed after the testing cell TC, i.e. on its receiving side relative to the conveying direction of the line.

The starting point in the design of the testing cell TC has been that the length of the testing cell in the direction of the production line should be as small as possible while the cell has a large testing capacity. Thus, the testing cell TC described in the example has a length of only about 1 meter in the direction of the line.

The testing cell TC comprises a set of test modules 4, each comprising a testing apparatus. In the examples presented here, the number of test modules is five, but it is to be noted that the number of test modules 4 may be higher or lower than that. The number of test modules is not limited in any way because it does not change the length of the testing cell in the longitudinal direction of the production line. There is usually always enough room in the vertical dimension in manufacturing plants. At least some of the test modules 4 are designed to perform different tests. In an embodiment, all the test modules 4 in the testing cell may be designed to perform mutually different tests.

Mounted inside each test module 4, of which an example is shown in FIGS. 4 and 5, is a horizontal module conveyor 5. The module conveyor 5 is a conventional circuit board conveyor which supports the circuit board by its opposite side edges. The module conveyor 5 can be adapted to accommodate circuit boards of different widths by adjusting the distance between the two halves of the conveyor. The module conveyor 5 moves the circuit board into a testing position in the test module 4, where it can be brought into the proper position in a conventional manner so as to allow an electric contact to be established by contacting means and the testing operations to be carried out. The module conveyor 5 receives the circuit board from the supply side A and removes it from the test module to the opposite or exit side B. In relation to each other, the test modules 4 of set I are arranged one above the other. The conveying directions of the module conveyors 5 of all test modules 4 are the same as the conveying direction of the line. The line conveyors 3 and 8 are plane conveyors which convey the circuit boards in a horizontal plane in succession as a file.

Among the circuit boards 1 conveyed on the circuit board manufacturing line, there are different circuit board types requiring different testing. Therefore, the set of test modules 4 in the testing cell TC comprises test modules differing from each other, performing different tests corresponding to different circuit board types.

Further, the testing cell TC comprises a feed elevator 6 located between the first line conveyor 3 and the test modules 4. The function of the feed elevator 6 is to collect from the first line conveyor 3 the circuit boards conveyed in succession so that they can be passed onto the module conveyors 5 of the test modules 4.

The feed elevator 6 comprises a number of horizontal first elevator plane conveyors 7, the number of which is six in this example. The number of elevator plane conveyors is at least equal to the number of superposed test modules. The elevator plane conveyor 7 is a conventional circuit board conveyor which supports the circuit board by its opposite side edges. The elevator plane conveyor 7 can be adapted so as to enable it to convey circuit boards of different widths by adjusting the distance between its two halves. The elevator plane conveyors 7 are disposed one above the other, spaced by a distance corresponding to the distance between the module conveyors 5. The conveying direction of the first elevator plane conveyors 7 is the same as the general conveying direction of the line. The elevator plane conveyors 7 are of a design permitting two-way operation.

The feed elevator 6 has been arranged to move the first elevator plane conveyors 7 vertically in successive order so as to bring each one of them into alignment with the first line conveyor 3 to allow one circuit board at a time to be received from the first line conveyor 3 onto each first elevator plane conveyor 7. Further, the feed elevator 6 has been arranged to move the first elevator plane conveyors 7 so as to bring them into alignment with the module conveyors 5, and to pass the circuit boards from the first elevator plane conveyors 7 onto the module conveyors 5 in preparation for a test to be performed in the test modules 4.

The testing cell TC is also provided with a receiving elevator 9 disposed on the exit side B of the test module set I, i.e. between set I and the second line conveyor 8. The function of the receiving elevator 9 is to receive the circuit boards from the module conveyors 5 of the test modules 4 and to deliver them onto the second line conveyor 8 so that they form a successive file on it. If necessary, the receiving elevator 9 can be used to feed circuit boards onto the module conveyors 5 of the test modules 4, so that, in cooperation with the feed elevator 6, circuit boards can be passed successively into and out of different test modules in desired order.

The structure of the receiving elevator 9 is identical to that of the feed elevator 6. The receiving elevator 9 comprises a number of horizontal second elevator plane conveyors 10, the number of which is six in this example. Their number is preferably at least equal to the number of superposed test modules. The elevator plane conveyor 10 is a conventional circuit board conveyor which supports the circuit board by its opposite side edges. The module conveyor 10 can be adapted to accommodate circuit boards of different widths by adjusting the distance between the two halves of the conveyor. The second elevator plane conveyors 10 are disposed one above the other, spaced by a distance corresponding to the distance between the module conveyors 5. The conveying direction of the second elevator plane conveyors 10 is the same as the conveying direction of the line conveyors 3, 8. The receiving elevator 8 has been arranged to receive the circuit boards from the module conveyors 5, to bring the second elevator plane conveyors 9 into alignment with the second line conveyor 8 so as to allow the circuit boards to be passed from the second elevator plane conveyors 10 onto the second line conveyor 8 so that they form a successive file on it. The elevator plane conveyors 10 are of design permitting two-way operation.

In the testing cell TC, the feed elevator 6, the test modules 4 and the receiving elevator 9 have been put together as a unitary assembly built into a common rack-like mounting frame 11. As can be seen from FIG. 3, the mounting frame 11 comprises guide supporters 12 disposed at a vertical distance from each other to support the test modules 4 one above the other. Supported by the guide supporters 12, the test module 4 can be removed from the mounting frame 11 and inserted into position by a horizontal movement. As is further shown in FIG. 1–3, in the testing cell TC the test modules 4 are disposed above the level of the line conveyors 3, 8. Mounted on the mounting frame 11 below the lowest one of the test modules in the test module set is additionally a horizontal transit conveyor 17 (see FIG. 8–10), arranged to be in alignment with the line conveyors 3, 8. By means of the transit conveyor 17 and elevator plane conveyors 7 and 10, circuit boards can be conveyed directly through the testing system when no testing is to be performed on them in the test modules 4. Below the transit conveyor 17 there is a control gear space 18 accommodating control equipment needed to control the test modules 4 and the feed elevators 6 and receiving elevators 9 etc.

As can be seen from FIG. 3, the circuit board 1 may be provided with an identification code or the like, defining a predetermined testing operation to be performed on the circuit board. Therefore, the system comprises an identifying device 100, which identifies the identification code. The feed device 6 has been fitted to feed the circuit board on the basis of the identification code into that test module 4 which will perform on the circuit board the testing operation predetermined for it.

FIGS. 4 and 5 present one test module 4. The test module 4 comprises a cassette-like frame box 13 with a module conveyor 5, a positioning and aligning device and contacting means together with their actuators mounted inside it. The box 13 is provided with openings placed in the region of the opposite ends of the module conveyors 5.

As shown in FIG. 3, the frame box 13 of the test module 4 comprises a back wall 14 provided with rear connectors 15 for the supply of electricity to the test module 4 and for the transfer of control data, among other things. The mounting frame 11 is provided with counter-connectors 16 which are so fitted that the rear connectors 15 and the counter-connectors 16 are connected together when the test module 4 is being mounted in the mounting frame 11.

FIGS. 6 and 7 illustrate the structure of the feed elevator 6 and/or receiving elevator 9. Fixed to the mounting frame 11 is a vertical guide rail 19. A hoisting slide 20 is mounted on the vertical guide rail 19 so that it can move along the guide rail. Attached to the hoisting slide 20 are elevator plane conveyors 7 or 10 at a fixed distance from each other. A positioning actuator 21 moves the hoisting slide 20 and the elevator plane conveyors attached to it and positions them accurately in a predetermined manner. In the example embodiment illustrated in the drawings, the positioning actuator 21 is a pneumatic linear drive unit (e.g. Festo Type DGPIL), whose conveying speed and about 0.1 mm positioning accuracy are sufficient for the purpose. The positioning actuators 21 used may alternatively consist of any other known servo-controlled actuators, such as a servomotor driven ball screw transmission, a linear stepping motor or the like.

FIG. 8 presents a diagram visualizing the operation of a testing cell. In the example illustrated in this figure, the testing cell comprises six test modules 4 placed one above the other, and the path of the circuit boards 1 passing through all the test modules is indicated in the figure by an arrow A. The feed elevator 6, the receiving elevator 9 and the test modules 4 are so controlled that they cooperate with each other to pass all the circuit boards 1 carried on the line successively through each test module 4 in the test module set, so that each circuit board undergoes six different testing operations in succession. In the figure, the feed and receiving elevators are in their low positions in an initial situation. The circuit boards are moved vertically by moving the feed elevator and the receiving elevator in the vertical direction, and horizontally by moving the elevator plane conveyors and the module conveyors in ways not described in detail in this context.

FIG. 9 illustrates a method of using the testing cell, wherein the circuit board 1 is provided with an identification code or the like, e.g. an optically readable bar code, which defines a predetermined testing operation to be performed on the circuit board. The code may also be an electrically readable code. For the identification of the code, an identifying device 100 is provided, placed before the testing cell, e.g. in the region of the first line conveyor 3, to control the operation of the feed elevator 6. The feed elevator 6 has been fitted to feed the circuit board 1 on the basis of the detected identification code into the one or the ones of the test modules 4 that perform the predetermined testing operations on the circuit board. The receiving elevator 9 is controlled in a corresponding manner. In the example, the first circuit board in the file needs a test which is performed in the test module placed next above the bottommost one, and the next circuit board in the file needs a test which is performed in the test module placed next below the topmost one. The corresponding paths of movement of the circuit boards are indicated in FIG. 9 by arrows B and C. The circuit boards are moved vertically by moving the feed elevator and the receiving elevator in the vertical direction, and horizontally by moving the elevator plane conveyors and the module conveyors in ways not described in detail in this context.

FIG. 10 presents a further embodiment of the testing cell TC, comprising two sets of test modules side by side, a first set I of test modules 4 placed one above the other and designed to perform different tests, and a second set II of test modules 4' placed one above the other and designed to perform different further tests on the circuit boards. Test modules 4' comprise a horizontal module conveyor 5' for moving a circuit board into the test module 4' from its input side and for moving it out of the test module 4' to the opposite or exit side of the module. The test modules 4' of the second set II are disposed in a superposed array in relation to each other adjacently to the test modules of the first set I so that their module conveyors 5, 5' are mutually in alignment in immediate vicinity of each other. The system is so implemented that the circuit boards 1 move simultaneously from the module conveyors 5 of the test modules 4 of the first set I directly onto the module conveyors 5' of the test modules 4' of the second set II. Although in this example only two adjacent sets of test modules are presented, it is obvious that in the framework of the invention the number of adjacent sets of test modules is not limited but that more than two sets may be provided.

The invention is not limited to the examples of its embodiments described above; instead, many variations are possible within the inventive idea defined in the claims.

What is claimed is:

1. Testing system for automatic testing of circuit boards (1) in a circuit board manufacturing line, said circuit boards (1) including different circuit board types requiring different testing, and said testing system comprising a testing apparatus (2) for performing testing operations, and said manufacturing line comprising a first line conveyor (3) for feeding circuit boards horizontally in succession as a file into the testing apparatus, characterized in that the testing system comprises;

a set (I) of test modules (4) comprising a testing apparatus, each one of said test modules comprising a horizontal module conveyor (5) for conveying a circuit board (1) into and out of the test module, said test modules being arranged in a superposed relation with respect to each other, and the set (I) contains test modules differing from each other so that the testing operations performed by these test modules are different from each other; and a feed device (6) fitted to receive circuit boards from the first line conveyor (3) and to feed them into the test modules (4).

2. System as defined in claim 1, wherein that the circuit board (1) is provided with an identification code or the like which defines a predetermined testing operation to be performed on the circuit board; that the system comprises an identifying device (100) for identifying the identification code; and that the feed device (6) has been fitted to feed the circuit board on the basis of the detected identification code into the one (4) of test modules that will perform the predetermined testing operation on the circuit board.

3. System as defined in claim 1, wherein that the manufacturing line comprises a second line conveyor (8), whose conveying direction is the same as the conveying direction of the first line conveyor (3) and which, as seen in the conveying direction, is disposed after the testing apparatus (2) to receive the circuit boards from the testing apparatus and to convey them horizontally in succession as a file; and that the system comprises a receiving device (9) disposed on the opposite side of the set of test modules in relation to the feed device (6), said receiving device (9) being fitted to receive circuit boards (1) from the test modules and to feed circuit boards onto the second line conveyor (8) so that they form a file on it.

4. System as defined in claim 1, wherein that each test module (4) in the set of test modules has been arranged to perform a different test than any other test module in the same set.

5. System as defined in claim 1, wherein that the feed device (6) has been arranged to both feed and receive a circuit board (1) into/from the test module (4); and that the receiving device (9) has been arranged to both receive and feed a circuit board (1) from/into the test module (4).

6. System as defined in claim 5, wherein that the feed device (6), the receiving device (9) and the test modules (4) have been arranged to cooperate with each other so as to pass the circuit boards successively through each test module in the test module set (I) so that a number of testing operations corresponding to the number of test modules are performed successively on the circuit boards.

7. System as defined in claim 1, wherein that the feed device (6) is a feed elevator (6) movable in a vertical direction and comprising a number of horizontal first elevator plane conveyors (7) disposed one above the other at a distance from each other corresponding to the distance between the module conveyors (5) so that, when the first elevator plane conveyors are in alignment with the module conveyors, the circuit boards can be moved from one conveyor onto the other.

8. System as defined in claim 3, wherein that the receiving device (9) is a vertically movable receiving elevator (9) comprising a number of horizontal second elevator plane conveyors (10) disposed one above the other at a distance from each other corresponding to the distance between the module conveyors (5) so that, when the second elevator plane conveyors are in alignment with the module conveyors, the circuit boards can be moved from one conveyor onto the other.

9. System as defined in claim 7, wherein that the module conveyors (4) are two-way conveyors.

10. System as defined in claim 7, wherein that the first elevator plane conveyors (7) and the second elevator plane conveyors (10) are two-way conveyors.

11. System as defined in claim 1, wherein that the system comprises a second set (II) of test modules (4') comprising a testing apparatus and disposed beside the first set (I) of test modules to perform a tests on the circuit boards that differ from the tests performed by the test modules (4) of the first set (I).

12. System as defined in claim 11, wherein that each test module (4') in the second set (II) comprises a horizontal module conveyor (5') for moving a circuit board into and out of the test module, and which test modules (4') of the second set (II) are disposed in a superposed relation to each other and adjacently to the test modules of the first set (I) so that their module conveyors (5, 5') are in alignment with each other in immediate vicinity of each other to allow the circuit boards (1) to be moved directly from the module conveyor (5) of a test module (4) of the first set (I) onto the module conveyor (5') of a test module (4') of the second set (II).

13. System as defined in claim 1, wherein that the feed device (6), the set (I, II) of test modules (4, 4') and the receiving device (9) have been assembled into a single unit built in a common mounting frame (11) to form a testing cell (TC) which can be incorporated in a modular manufacturing line consisting of different cells.

14. System as defined in claim 13, wherein that the mounting frame (11) comprises guide supporters (12) placed at a vertical distance from each other to support the test modules (4, 4') one above the other and allowing the test module supported by said guide supporters to be removed from and inserted into the mounting frame by a horizontal movement.

15. System as defined in claim 1, the test module (4, 4') comprises a cassette-like frame box (13), inside which the module conveyor (5) and the testing apparatus are mounted, said frame box comprising a back wall (14) provided with rear connectors (15) for the supply of electricity or the like and/or for the transfer of control data; and that the mounting frame (11) is provided with counter-connectors (16) so fitted that the rear connectors and the counter-connectors are coupled when the test module is being mounted in the mounting frame.

16. System as defined in claim 1, wherein that the test modules (4, 4') are disposed above the level of the line conveyors (3, 8).

17. System as defined in claim 16, wherein that the system comprises a horizontal transit conveyor (17) disposed below the lowest test module (4, 4') in the test module set (I, II), in alignment with the line conveyors (3, 8), for conveying circuit boards through the testing system without having them tested.

18. System as defined in claim 16, wherein that the mounting frame (11) comprises a control gear space (18) disposed below the test modules (4, 4') to accommodate control devices used to control the test modules and the feeding and receiving elevators (6, 9).

19. System as defined in claim 7, wherein that the feed elevator (6) and/or the receiving elevator (9) comprises a vertical guide rail (19) fixed to the mounting frame (11); a hoisting slide (20) arranged to be movable along the vertical guide rail, the elevator plane conveyors (7, 10) being connected to said hoisting slide one above the other at a fixed distance from each other; and a positioning actuator (21) for moving and positioning the hoisting slide.

* * * * *